(12) United States Patent
Grünberger et al.

(10) Patent No.: US 12,556,190 B2
(45) Date of Patent: Feb. 17, 2026

(54) STARTUP CALIBRATION AND DIGITAL TEMPERATURE COMPENSATION FOR AN OPEN-LOOP VCO BASED ADC ARCHITECTURE

(71) Applicant: Infineon Technologies AG, Neubiberg (DE)

(72) Inventors: Simon Grünberger, Moosburg (AT); Dietmar Straeussnigg, Villach (AT); Florian Brame, Villach (AT); Pedro Augusto Borrego Lambin Torres Amaral, Villach (AT); David Andrew Russell, Bernareggio (IT); Carlos Andres Perez Cruz, Santa Cruz del Retam (ES)

(73) Assignee: Infineon Technologies AG, Neubiberg (DE)

( * ) Notice: Subject to any disclaimer, the term of this patent is extended or adjusted under 35 U.S.C. 154(b) by 386 days.

(21) Appl. No.: 18/324,846

(22) Filed: May 26, 2023

(65) Prior Publication Data
US 2024/0396563 A1  Nov. 28, 2024

(51) Int. Cl.
*H03M 1/06* (2006.01)
*H03M 1/10* (2006.01)
*H04R 29/00* (2006.01)

(52) U.S. Cl.
CPC ....... *H03M 1/0604* (2013.01); *H03M 1/1014* (2013.01); *H04R 29/004* (2013.01)

(58) Field of Classification Search
CPC .. H03M 1/0604; H03M 1/1014; H04R 29/004
See application file for complete search history.

(56) References Cited

U.S. PATENT DOCUMENTS

| | | | | |
|---|---|---|---|---|
| 9,154,146 B1* | 10/2015 | Chiu | ................... | H03M 1/1042 |
| 2006/0176197 A1* | 8/2006 | McNeill | ............. | H03M 1/1004 |
| | | | | 341/120 |
| 2007/0080844 A1* | 4/2007 | Terazawa | ............ | H03M 1/1019 |
| | | | | 341/155 |
| 2013/0321190 A1* | 12/2013 | Lesso | .................... | H03M 1/186 |
| | | | | 341/158 |

(Continued)

OTHER PUBLICATIONS

Mcneill, John A., et al., ""Split ADC" Background Linearization of VCO-Based ADCs", IEEE Transactions on Circuits and Systems—I: Regular Papers, vol. 62, No. 1, Jan. 2015.

(Continued)

*Primary Examiner* — Daniel R Sellers
(74) *Attorney, Agent, or Firm* — Slater Matsil, LLP

(57) ABSTRACT

A digital microphone includes a first modulation path having an input for receiving an analog input signal and an output for generating a first digital signal; a second modulation path having an input for receiving the analog input signal and an output for generating a second digital signal; a summing circuit having a first input for receiving the first digital signal, a second input for receiving the second digital signal, and an output for generating a digital calibration path signal; and a difference circuit having a first input for receiving the first digital signal, a second input for receiving the second digital signal, and an output for generating a digital signal path signal.

15 Claims, 14 Drawing Sheets

(56) References Cited

U.S. PATENT DOCUMENTS

2015/0131812 A1* 5/2015 Schober ............... H04R 17/02
                                                                    381/114

OTHER PUBLICATIONS

Mohseni, Zahra et al., "A 10-b (9.1-b ENOB), TP-Robust Open-Loop VCO-based ADC in 65 nm CMOS", Int. J. Electron. Commun. (AEU) 150, Apr. 14, 2022, 7 pages.

Quintero, Andres et al., "A VCO-Based CMOS Readout Circuit for Capacitive MEMS Microphones", Sensors, MDPI, www/mdpi.com/journal/sensors, doi:10.3390/s19194126, Sep. 24, 2019, 17 pages.

Perez, C., et al., "A 73dB-A Audio VCO-ADC Based on a Maximum Length Sequence Generator in 130nm CMOS," IEEE Transactions on Circuits and Systems—II: Express Briefs, vol. 68, No. 10, Oct. 2021, 5 pages.

* cited by examiner

STARTUP CALIBRATION AND DIGITAL TEMPERATURE COMPENSATION FOR AN OPEN-LOOP VCO BASED ADC ARCHITECTURE

TECHNICAL FIELD

The present invention relates generally to startup calibration and digital temperature compensation for an open-loop voltage-controlled oscillator (VCO)-based analog-to-digital converter (ADC) architecture and, in particular embodiments, to a corresponding method.

BACKGROUND

Digital microphones are known in the art. Typically, digital microphones include an application-specific integrated circuit (ASIC) that includes at least one ADC for converting an analog input signal from a microelectromechanical system (MEMS) device into a digital output signal representative of sound waves sensing by the MEMS device. In many existing digital microphones, closed-loop sigma-delta based ADC architectures are used. These ADC architectures generally have sensitivities that are not dependent on sampling frequency and process corners. In some newer digital microphones, open loop VCO-based ADC architectures are used. These open loop VCO-based ADC architectures have several notable advantages such as low power, low integrated circuit area, increased performance (for example increased signal-to-noise ratio), low group delay, and improved shock recovery. However, in some of the newer microphones, these ADC architectures can have sensitivities that are dependent upon sampling frequency, process corners, and temperature.

SUMMARY

According to an embodiment, a digital microphone comprises a first modulation path having an input for receiving an analog input signal and an output for generating a first digital signal; a second modulation path having an input for receiving the analog input signal and an output for generating a second digital signal; a summing circuit having a first input for receiving the first digital signal, a second input for receiving the second digital signal, and an output for generating a digital calibration path signal; and a difference circuit having a first input for receiving the first digital signal, a second input for receiving the second digital signal, and an output for generating a digital signal path signal.

According to an embodiment, a digital microphone comprises an analog-to-digital converter (ADC); a digital signal path coupled to the ADC; a temperature sensor; and a temperature compensation circuit coupled to the temperature sensor and to a node of the digital signal path, wherein the temperature compensation circuit is configured for providing a correction gain to the digital signal path during a normal mode of operation.

According to an embodiment, a method of operating a digital microphone, the method comprising modulating an analog input signal to generate a first digital signal; modulating the analog input signal to generate a second digital signal; summing the first digital signal and the second digital signal to generate a digital calibration path signal; and determining a difference between the first digital signal and the second digital signal to generate a digital signal path signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

In digital microphones sensitivity is designed to stay within a certain specified range (e.g. nominal+/−0.5 dB). This specification is sometimes known as "sensitivity stability." Sensitivity stability must be fulfilled over process variations, sampling frequency variation, and the operating temperature range. The open-loop VCO-based ADC architecture, described herein, generally has the property that sensitivity depends on sampling frequency and process variations, as well as operating temperature range. The gain of an open-loop VCO-based ADC is given by the following equation:

$$\text{Gain}=KVCO*2*Nph/Fclk, \qquad [1]$$

wherein KVCO is the VCO gain in MHz/volts, Nph is the (fixed) number of phases of the VCO and Folk is the sampling clock frequency. In general, KVCO depends on process, voltage, and temperature variations.

Figure 1:
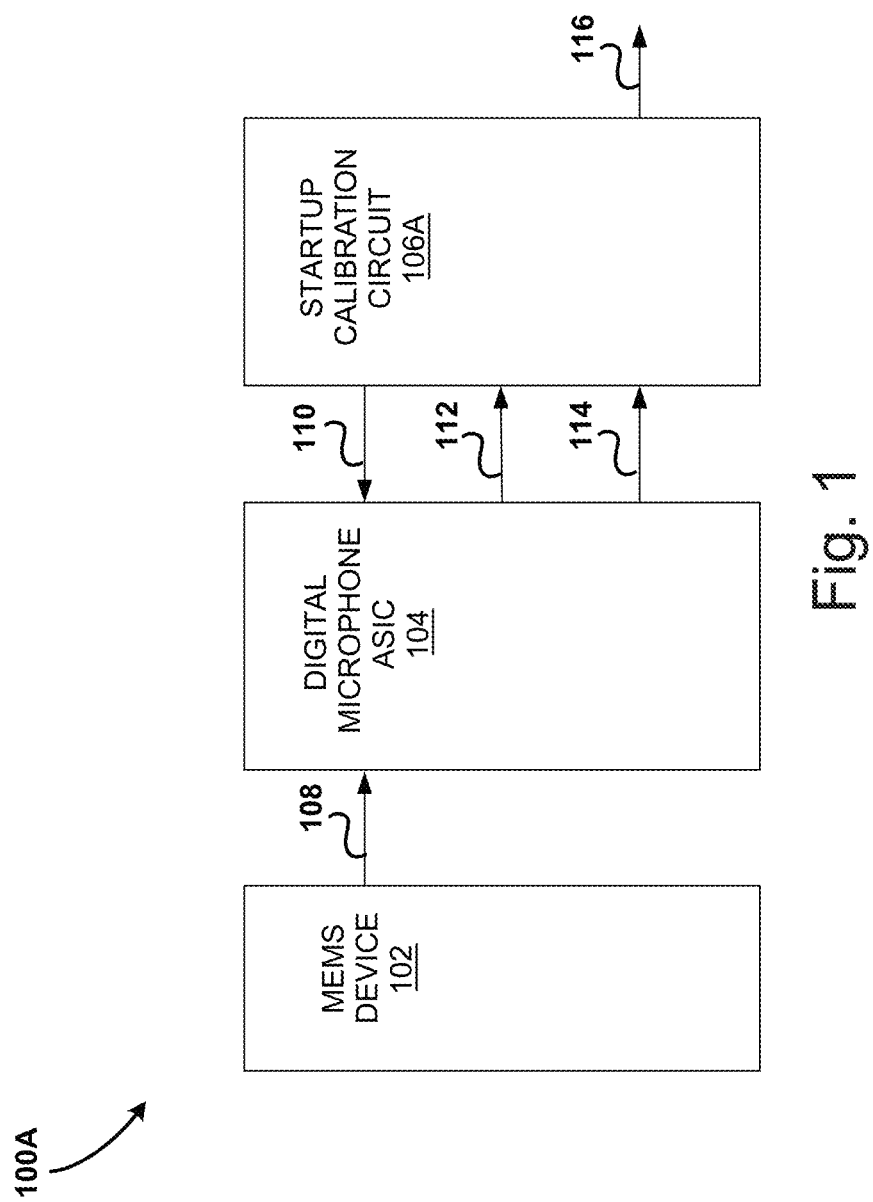
FIG. 1 is a block diagram of a digital microphone including a MEMS device, an ASIC including a VCO-based ADC architecture, and a startup calibration circuit, according to an embodiment.

FIG. 1 is a block diagram of a digital microphone 100A including a MEMS device 102, an ASIC 104 including an open loop VCO-based ADC architecture, and a startup calibration circuit 106A, according to an embodiment. MEMS device 102 generates an analog signal at node 108, which is received as an input by ASIC 104. ASIC generates digital signals at node 112 and node 114 received by startup calibration circuit 106, and receives a digital signal from startup calibration circuit 106 at node 110. Startup calibration circuit 106 provides a digital output signal at output node 116. The ASIC 104 is described in further detail below with respect to the block diagram of FIG. 2, and the startup calibration circuit 106 is described in further detail below with respect to the block diagram of FIG. 3A.

Figure 2:
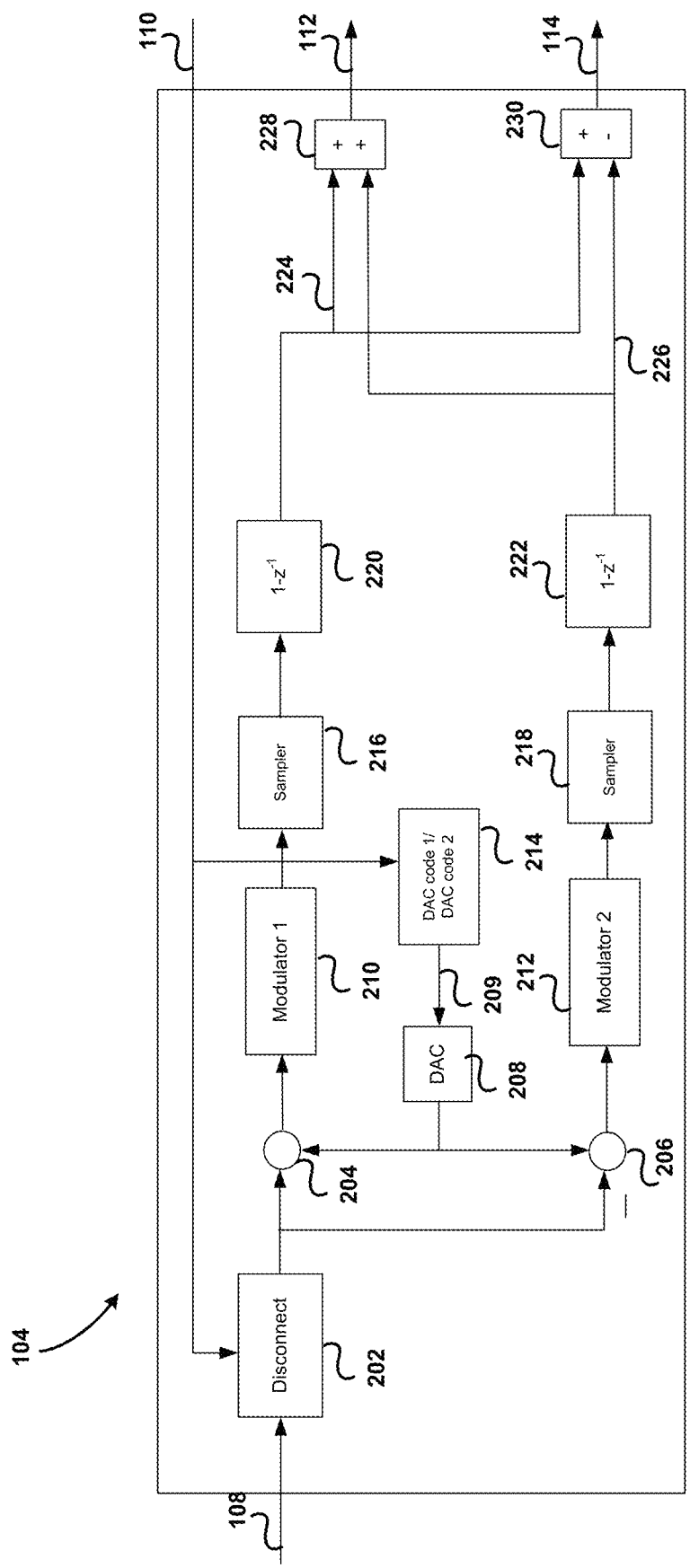
FIG. 2 is a more detailed block diagram of the ASIC shown in FIG. 1.

FIG. 2 is a more detailed block diagram of the digital microphone ASIC 104 shown in FIG. 1. In particular, digital microphone ASIC 104 comprises a VCO-based ADC architecture. The ADC architecture comprises has two branches including a first modulator 210 and a second modulator 212. Each modulator comprises a VCO in an embodiment. The outputs of first modulator 210 and second modulator 212 are respectively sampled by a first sampler 216 and a second sampler 218. The output of the first sampler 216 is coupled to a first inverse Z-transform component 220, and the output of the second sampler 218 is coupled to a second inverse Z-transform component 222. The output of the first inverse Z-transform component 220 and a positive input of difference circuit 230 are coupled to node 224. The output of the second inverse Z-transform component 222 and a negative input of difference circuit 230 are coupled to node 226. The difference of the two inverse Z-transform signals gives the final ADC output at node 114.

ASIC 104 also includes a number of components that are used in a startup calibration mode, which is described in further detail below. ASIC 104 includes a disconnect circuit 202 for disconnecting the ASIC input from node 108 during the startup calibration mode. Disconnect circuit 202 receives a control signal on node 110 for selectively engaging or disengaging the disconnect function. The output of the disconnect circuit 202 is coupled to a positive input of summer 204 and a negative input of summer 206. An output of digital-to-analog converter (DAC) 208 is coupled to another positive input of summer 204 and a positive input of summer 206. An output at node 209 of register 214 (including first and second DAC codes) is coupled to an input of DAC 208, and also receives a control signal on node 110 for toggling between the first and second DAC codes during the startup calibration mode. In addition, ASIC 104 includes a summer 228 having a first input coupled to node 224 and a second input coupled to node 226, and an output for providing a digital calibration signal at node 114.

Figure 3A:
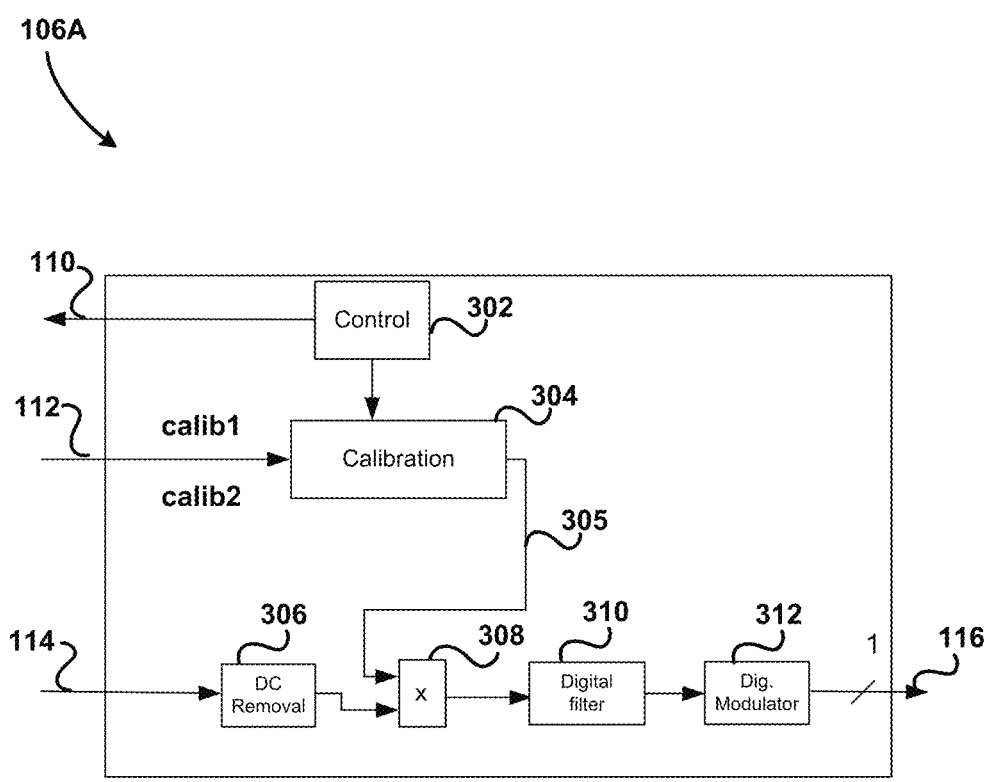
FIG. 3A is a more detailed block diagram of the startup calibration circuit shown in FIG. 1.

FIG. 3A is a more detailed block diagram of the startup calibration circuit 106A shown in FIG. 1. Startup calibration circuit 106A includes a control circuit 302 for generating a control signal on node 110, and a calibration calculation block 304. In an embodiment, calibration calculation block 304 comprises a general purpose processor or a logic circuit for implementing calculation algorithms. The calibration calculation block 304 receives the digital calibration signal at node 112, and another control signal from control circuit 302. Control circuit 302 and calibration calculation block 304 comprise a calibration signal in an embodiment. Startup calibration circuit 106A also includes a signal path including a DC removal circuit 306 coupled to node 114, a multiplication circuit 308 having a first input coupled to the output of the calibration calculation block 304 at node 305 and a second input coupled to the output of DC removal circuit 306. The multiplication circuit 308 is configured to perform a desired multiplication function such as "shift and add" multiplication, "bit serial" multiplication, or array multiplication, among other such digital multiplication techniques. Startup calibration circuit 106A also includes a digital filter 310 coupled to the output of the multiplication circuit 308, and an optional one-bit digital modulator 312 coupled between the output of digital filter 310 and output node 116. In some embodiments, the startup calibration circuit 106A can be fabricated on the same integrated circuit as ASIC 104.

The startup calibration method is implemented for measuring and correcting the sensitivity of the digital microphone during a startup mode of operation, in an embodiment. Other digital microphone parameters, other than sensitivity, can also be used and are reviewed below. In the sensitivity startup calibration method, according to an embodiment, the digital microphone sensitivity is measured during startup by sequentially applying two constant values via DAC 208 (DAC code 1 and DAC code 2 stored in register 214). It is important to note that during the sensitivity measurement the input of ASIC 104 is disconnected (or isolated, i.e. no audio signal is added to the input signal). Thus, during startup disconnection of the ASIC 104 input is accomplished using disconnect circuit 202, previously described. For the measurement of the sensitivity of the digital microphone the sum (using summer 228) of the signals at node 224 and node 226 ("output for calibration") is evaluated (e.g. averaged to get a measurement result with high resolution). Using the two measurement results (one from the first DAC code, and one from the second DAC code) the sensitivity of the VCO-based ADC in ASIC 104 is calculated and finally the appropriate correction gain is determined. The correction gain is then applied to the signal path (using multiplication circuit 308) to adjust the sensitivity to the desired target level, if a deviation due to process or changed clock frequency occurs.

Initially, the "nominal" ADC gain is measured for a "reference or nominal" ADC. That is for a given default operating mode, default room temperature, nominal process and nominal sampling frequency (for example, 3.072 MHz). For a "nominal" ADC in "nominal" conditions a first input reference voltage is applied (DAC code 1, as shown in FIG. 2), and the corresponding digital output in the summing path is obtained (on node 112). This digital output at node 112 can be averaged (inside of calibration calculation block 304) for a variable number of sampling clocks, to reduce the effects of noise (such as quantization, common mode noise, or other noise sources). A first digital number designated "calib1" is thus obtained. The same procedure is repeated for a second reference voltage, provided by the same reference DAC (DAC code 2, shown in FIG. 2). A second digital output "calib2" is thus obtained. The difference between these two digital numbers "calib2"-"calib1" is therefore a direct measure of the overall gain (sensitivity) of the VCO-based ADC in ASIC 104. The digital number "kvco_nom"="calib2"-"calib1" for the "nominal" ADC in "nominal" conditions can be stored in non-volatile memory inside of ASIC 104 (for example inside a register in the calibration calculation block 304). In an embodiment, "kvco_nom" is fused with an individually determined value for every microphone device. In another embodiment, multiple microphone devices are fused with the same "kvco_nom" value (for example all microphone devices on a single wafer.)

The startup calibration method can be used to correct for higher or lower than normal sensitivities. For example, for a given sample, upon startup it is determined that the sampling clock has increased by 10% over the nominal value. The startup algorithm then compute a new "kvco"="calib2-calib1" which is 10% smaller. The digital algorithm then applies a digital gain of 1.1 (10% higher than 1.00) to correct for this reduced gain/sensitivity. In one implementation, a LUT table is used to efficiently implement this gain. In other embodiments, process, voltage, and initial temperature can also be corrected. A temperature calibration method, for example is described below with respect to the embodiments of FIGS. 4A-7 that cover gain correction for both startup and continuous operation, in contrast to the embodiment of FIG. 3A wherein the gain correction is calculated and applied only during a startup mode of operation.

In some embodiments additional information can also be extracted from the "calib1" and "calib2" digital numbers described above. For example, the "calib1" magnitude can be used to identify fast or slow samples and eventually reconfigure the VCO in the VCO-based ADC. For example, the number of programmable gate "fingers" in inverters in the VCO in order to increase overall ASIC yield. The "calib1" and "calib2" digital numbers can also be used to avoid an integer ratio between a VCO free running frequency and a sampling frequency that might cause increase noise due to sub-sampling of the VCO by a slower Folk sampling frequency.

Figure 3B:
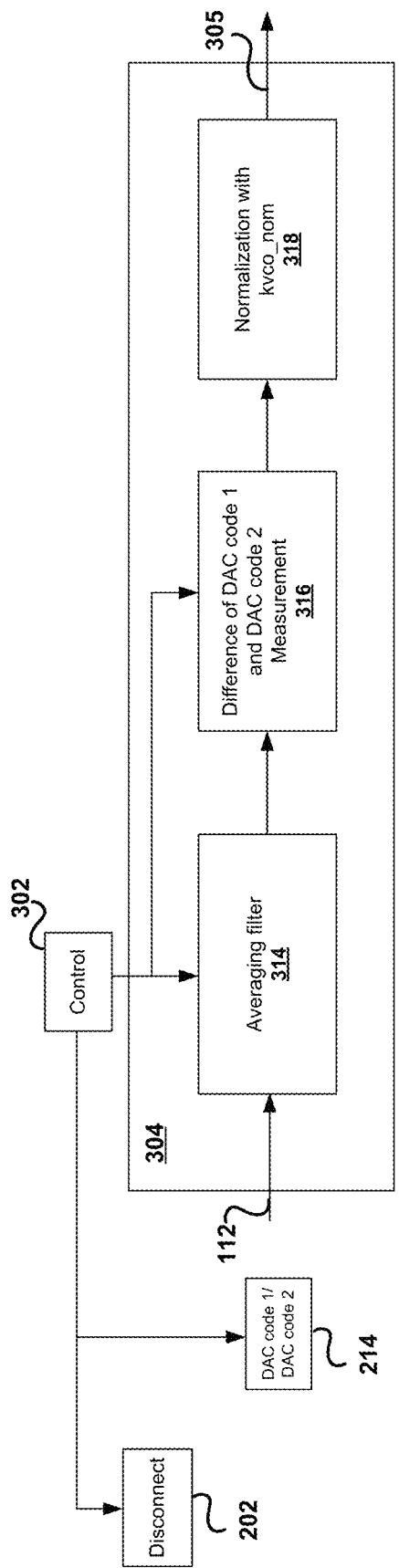
FIG. 3B is a contextual figure showing further details of the calibration calculation block in context with selected other components shown in FIG. 3A and FIG. 2.

FIG. 3B is a contextual figure showing further details of the calibration calculation block 304 in context with selected other components shown in FIG. 3A and FIG. 2. Calibration calculation block 304 comprises an averaging filter 314 coupled to node 112, a difference component 316 for calculating the difference of the DAC code 1 and the DAC code 2 measurements coupled to the averaging filter 314, and a normalization component 318 for normalizing the difference with the "kvco_nom" value. The normalization component 318 is coupled between the output of normalization component 318 and node 305. Calibration calculation block 304 is also coupled to control circuit 302, which in turn is coupled to disconnect circuit 202, and register 214 as previously described.

Figure 3C:
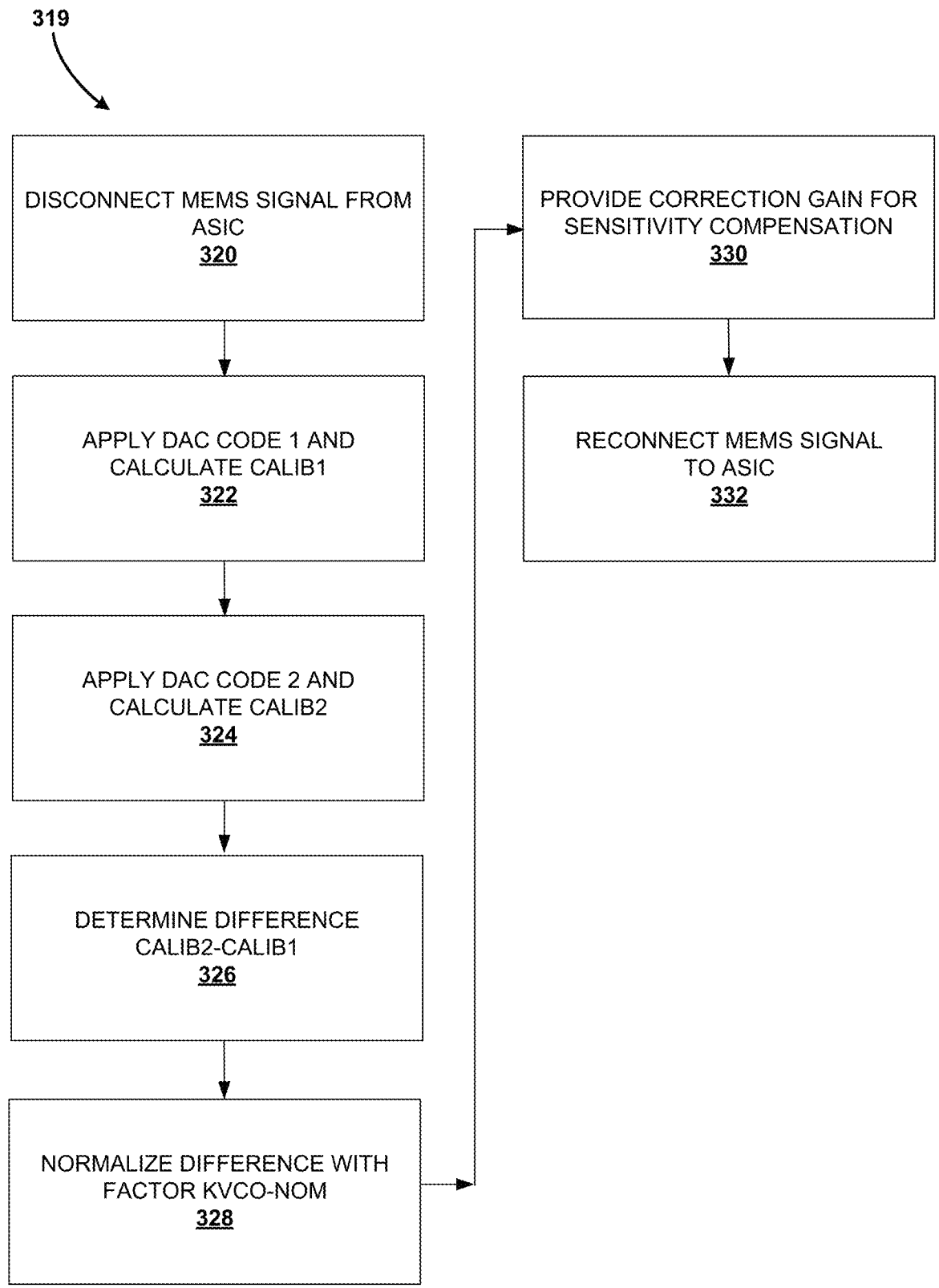
FIG. 3C is a flow chart of a startup calibration algorithm according to an embodiment.

FIG. 3C is a flow chart 319 of a startup calibration algorithm according to an embodiment. The MEMS signal from MEMS device 102 is disconnected from ASIC 104 at step 320. DAC code 1 is applied and the value of "calib1" is calculated at step 322. DAC code 2 is applied and the value of "calib2" is calculated at step 324. The difference between "calib1" and "calib2" is determined at step 326. The difference is normalized with "kvco_nom" at step 328. The correction gain for sensitivity compensation is provided at step 330. The MEMS signal from MEMS device 102 is reconnected to ASIC 104 at step 332.

In summary, an architecture for a VCO-based ADC has been described that includes a startup calibration mode for maintaining sensitivity stability in a digital microphone, according to an embodiment. However, in other embodiments calibration of any parameters of a digital microphone could also be used during startup. The sensitivity stability calibration during startup describe herein, is just one example. Alternative calibration methods are described below.

The digital microphone sensitivity change due to the change of an external clock (or deviation from a nominal clock) could also be calibrated using other methods. To correct the sensitivity due to a clock change (or deviation from nominal clock) only the change ("delta") of the clock is required. The "delta" can be determined using an accurate clock frequency detection circuit (CFD, which is a circuit found in many digital microphones). The "delta" could also be measured in other ways and used for sensitivity calibration in some embodiments.

The sensitivity change can also be calibrated with an adaptation algorithm during startup. In this case a training sequence is applied via the DAC 208 (described above) and the delta sensitivity is determined by an adaptation algorithm (e.g. gradient approach, sign-sign algorithm, or other such algorithms).

Figure 3D:
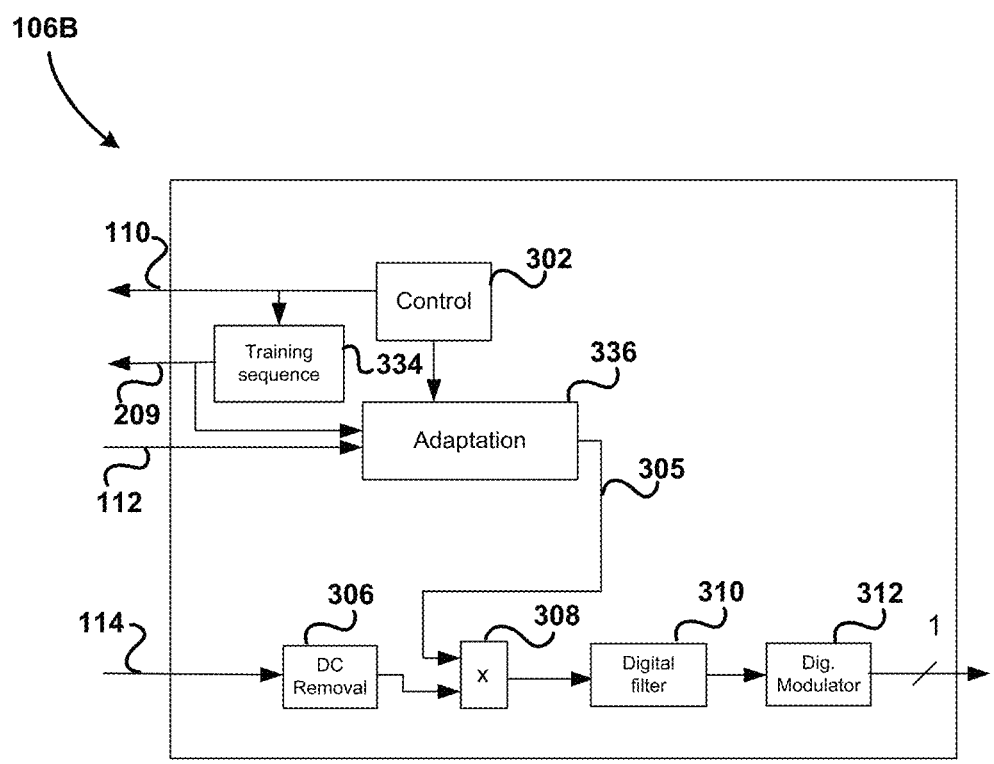
FIG. 3D is a more detailed block diagram of an alternative startup calibration circuit according to an embodiment.

FIG. 3D is a more detailed block diagram of an alternative startup calibration circuit 106B, suitable for use with the adaptation algorithm embodiment. Startup calibration circuit 106B includes several components and nodes that were previously described with respect to startup calibration circuit 106A. For example, startup calibration circuit 106B includes a control circuit 302, a DC removal circuit 306, a multiplication circuit 308, a digital filter 310, and a digital modulator 312 were all previously described. Similarly, node 110, node 112, and node 114 were all previously described. Startup calibration circuit 106B includes a training sequence register 334 and an adaptation algorithm component 336. Training sequence register 334 has an output coupled to node 209, which is the input of DAC 208. In the adaptation algorithm embodiment, register 214 of ASIC 104 is omitted. The output of training sequence register 334 is also coupled to a first input of the adaptation algorithm component 336. A second input of the adaptation component is coupled to node 112. The output of the adaptation algorithm component 336 is coupled to node 305.

Figure 3E:
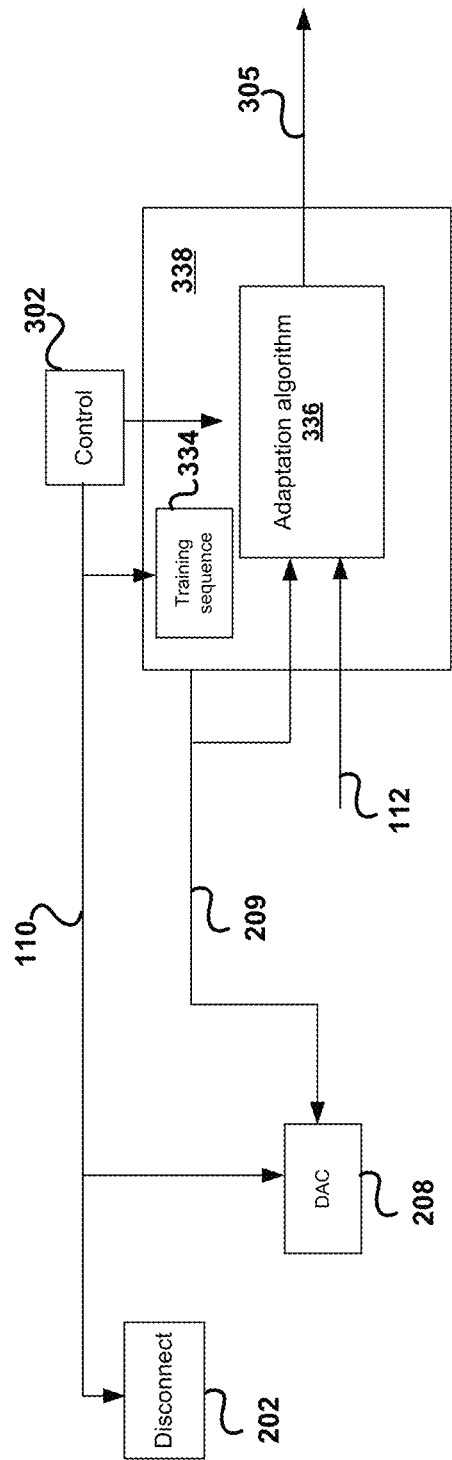
FIG. 3E is a contextual figure showing further details of an adaptation algorithm block according to an embodiment.

FIG. 3E is a contextual figure showing further details of an adaptation algorithm block 338 including training sequence register 334 and adaptation algorithm component 336 previously described. Adaptation algorithm block 338 is shown in context with selected other components shown in FIG. 3D and FIG. 2. Training sequence register 334 has an input coupled to node 110. An output of control circuit 302 is coupled to an input of adaptation algorithm component 336. The output of adaptation algorithm component 336 is coupled to node 305. Control circuit 302 is in turn is coupled to disconnect circuit 202 and DAC 208 as previously described.

Figure 3F:
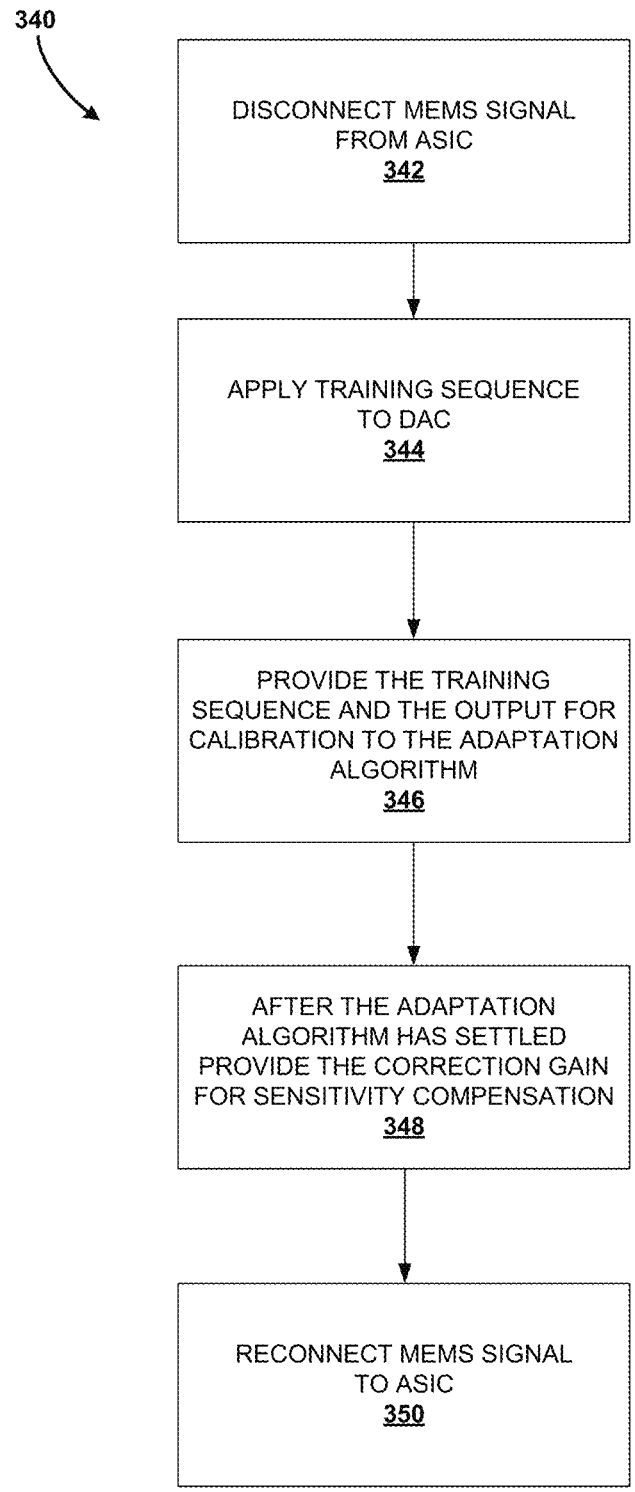
FIG. 3F is a flow chart of an adaptation algorithm according to an embodiment.

FIG. 3F is a flow chart 340 of the adaptation algorithm. In operation, the MEMS signal from MEMS device 102 is disconnected from ASIC 104 at step 342. A training sequence is applied to DAC 208 at step 344. The training sequence is also provided to the input of the adaptation algorithm component 336 at step 346. After the adaptation algorithm has settled to a final value, the correction gain is provided at node 305 for the sensitivity compensation at step 348. After the correction gain is provided, the MEMS signal from MEMS device 102 can be reconnected to ASIC 104 at step 350.

The sensitivity change due to ASIC semiconductor process variations could also be calibrated by monitoring the delta in ASIC process fabrication, by monitoring the reference oscillator frequency and/or bandgap/reference currents. To correct the sensitivity due to the deviation from nominal process just the delta is needed, and this could be coded into an internal Look-up-Table, for example.

Similarly, for the initial temperature dependence, a temperature sensor might be used and the corresponding correction applied, based on the delta from default (room temperature). A technique for temperature calibration that can be used in either startup mode or during normal operation is described below with respect to FIGS. 4A-7.

In digital microphones, as previously described, sensitivity stability is usually within a certain specified range (e.g. nominal+/−0.5 dB). It is desirable that sensitivity stability meet this specification over process corners, sampling frequency variation, and also temperature variations. For VCO-based ADCs used in digital microphones, as previously described, KVCO depends on process, voltage and temperature. KVCO changing with temperature during normal operation means that sensitivity will also drift without any additional correction method.

According to embodiments a method and implementation for temperature calibration of a digital microphone is also described, which substantially solves sensitivity drift due to temperature drift in VCO-based digital microphone ADC architectures, especially for the temperature dependency during normal operation. Temperature calibration, however, can also be performed during a startup mode to ensure that even the initial sensitivity of the digital microphone is within specification limits. In general, the gain of the digital microphone is corrected depending on the temperature during operation to keep the sensitivity within a certain specified range. Temperature calibration embodiments also advantageously address preventing audible artefacts due to changing the digital microphone sensitivity during normal operation. An instant gain-change can cause such audible artefacts. Instead, a "ramping" change of the gain from an initial value to a corrected value is implemented to prevent the audible artefacts.

Figure 4A:
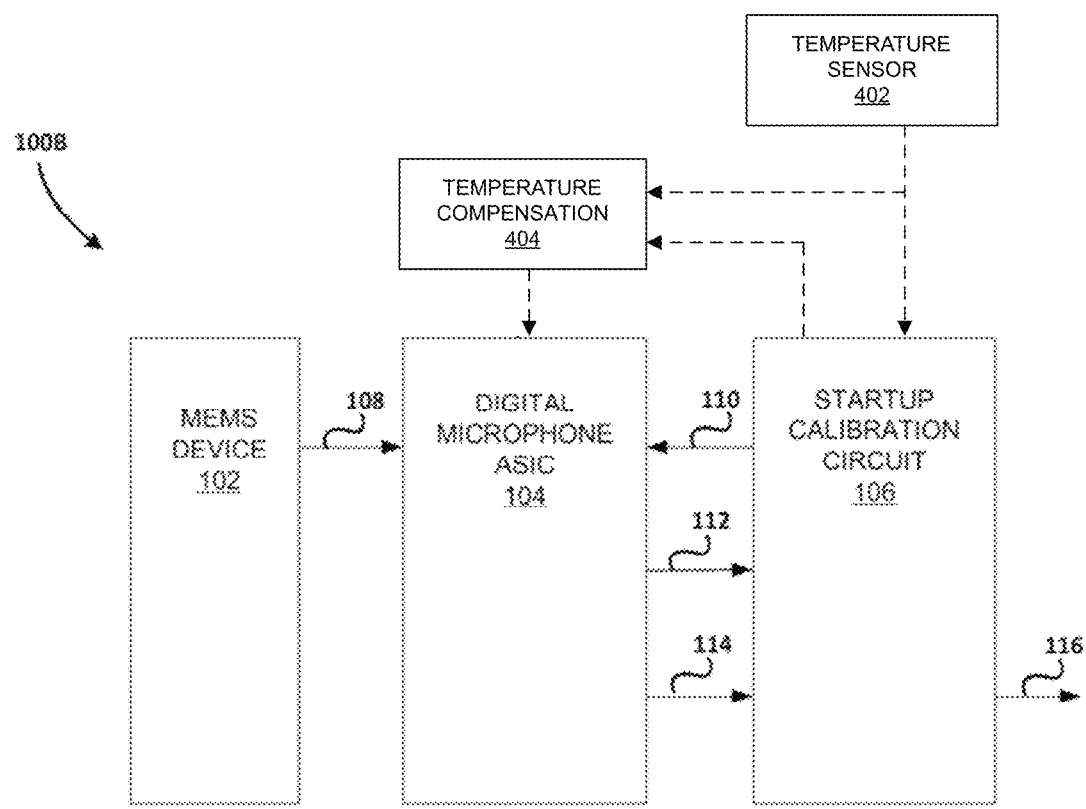
FIG. 4A is a block diagram of a digital microphone including a MEMS device, an ASIC including a VCO-based ADC architecture, a startup calibration circuit, and a temperature compensation circuit coupled either to the ASIC or to the startup calibration circuit, according to embodiments.

FIG. 4A is a block diagram of a digital microphone 100B having a temperature calibration circuit including a MEMS device 102, an ASIC 104 including a VCO-based ADC architecture, a startup calibration circuit 106, as well as node 108, node 110, node 112, node 114, and output node 116, all previous described. Digital microphone 100B includes a temperature sensor 402 for sensing the current temperature coupled to an input of temperature compensation circuit 404, and to an input of the startup calibration circuit 106, in an embodiment. An output of startup calibration circuit 106 is coupled to an input of the temperature compensation circuit 404, in an embodiment. An output of temperature compensation circuit 404 is coupled to the ASIC 104, according to embodiments. In pertinent part, the temperature-based extra gain correction provided by the temperature compensation circuit 404 can be injected into any part of the signal path of digital microphone 100B including the signal path portion in the digital microphone ASIC 104, or in the signal path portion in the startup calibration circuit 106. In the case where ASIC 104 and the startup calibration circuit 106 are combined in a single ASIC, then the extra gain correction provided by temperature compensation circuit 404 can be injected into any part of the signal of the combined single ASIC. While a particular topology for interconnecting the components is shown in FIG. 4A, it will be clear to those skilled in the art that various other partitioning and interconnection of these components is possible in other embodiments. The temperature compensation circuit 404 is explained in further detail below and includes a ramping circuit for preventing audible artefacts when used during a continuous mode of operation.

Figure 4B:
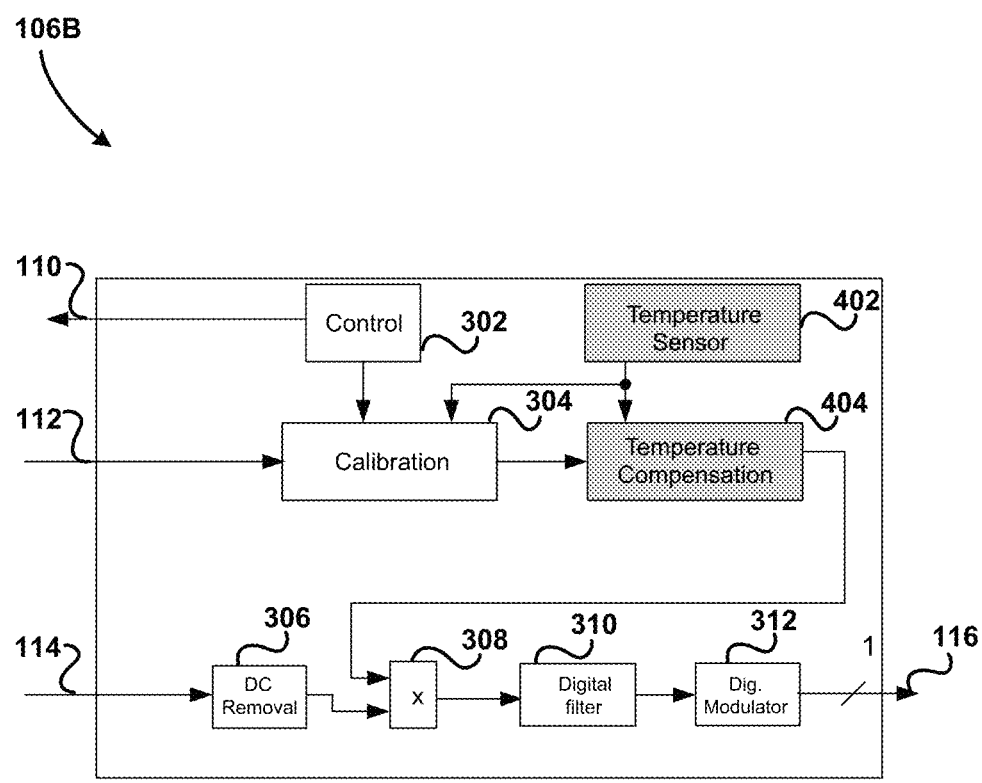
FIG. 4B is a more detailed block diagram of the startup calibration circuit of FIG. 4A including the temperature compensation circuit.

FIG. 4B is a more detailed block diagram of the startup calibration circuit 106B of FIG. 4A including the temperature sensor 402 and the temperature compensation circuit 404. Startup calibration circuit 106B also includes control circuit 302, calibration calculation block 304, DC removal circuit 306, multiplication circuit 308, digital filter 310, node 110, node 112, node 114, and output node 116, all previously described. The temperature sensor 402 comprises any appropriate integrated circuit temperature sensor. The output of temperature sensor, which is a voltage proportional to the sensed temperature, is received by both the calibration calculation block 304 and the temperature compensation circuit 404. The temperature compensation circuit 404 has an input coupled to an output of the calibration calculation block 304 and an output coupled to an input of multiplication circuit 308.

In operation, startup calibration circuit 106B calculates a correction gain to adjust the sensitivity of the digital microphone 100B to a target level. The correction gain is applied to the signal path of digital microphone 100B, if a deviation due to process or changed clock frequency occurs. In particular, the correction gain is applied to an input of multiplication circuit 308 during a startup mode of operation, in an embodiment.

During a continuous operation of digital microphone 100B, the temperature compensation circuit 404 compensates the temperature dependency of the VCO-based architecture by adding a further temperature-dependent correction gain. Further details of temperature compensation circuit 404 are described below. The VCO-based ADC architecture of digital microphone 100B supports different operating modes (e.g. low power mode, normal mode, and high performance mode). Each one of these different operating modes requires a different temperature correction. It is important to note that temperature compensation according to embodiments can be performed both in the startup phase and during the continuous mode of operation. The temperature compensation circuit makes no differentiation between the low power, normal or high performance mode. The temperature compensation in the continuous mode of operation compensate possible sensitivity drift independent of the specific operating mode.

Figure 5:
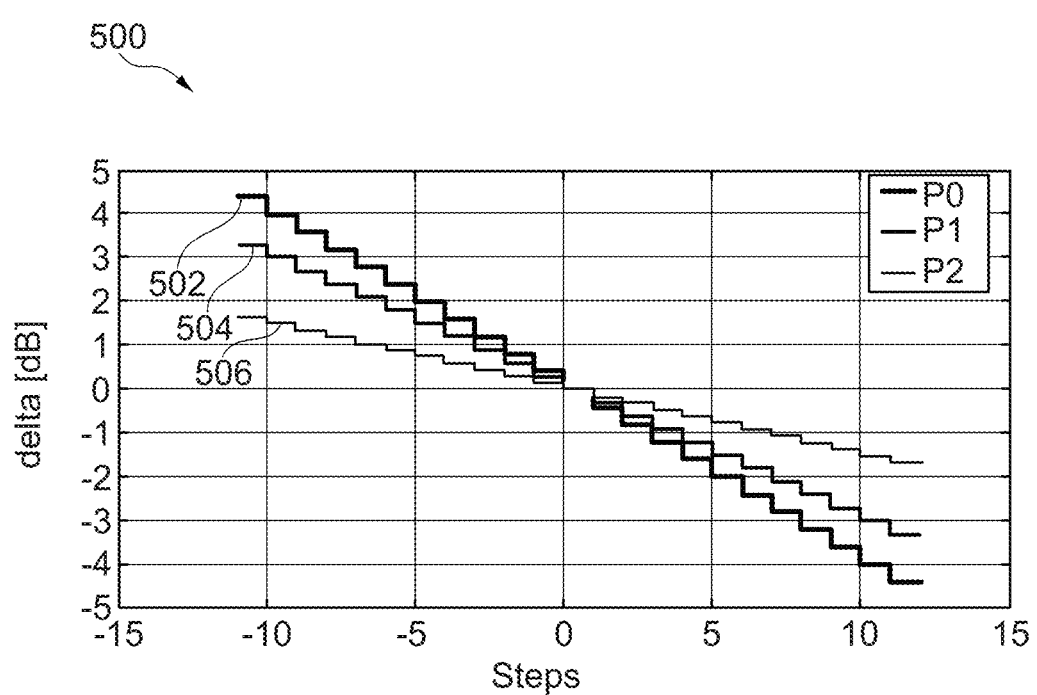
FIG. 5 is a graph of a plurality of stepped gain correction traces realized with look-up-tables (LUTs), corresponding to a plurality of different operating modes.

FIG. 5 is a graph of a plurality of stepped gain correction traces realized with look-up-tables (LUTs), corresponding to a plurality of different operating modes. The stepped or ramped gain is explained in further detail below with respect to FIG. 6 and FIG. 7. The x-axis of FIG. 5 shows time steps of the correction gain in unit steps, and the y-axis of FIG. 5 shows the change in the correction in decibels (dB) for three different operating modes. The x-axis reflects the difference between a reference-point (the startup-calibration temperature window) and the actual temperature window. The temperature sensor provides the temperature information and a coarse quantized information called a temperature window, which is sufficient for the delta-gain estimation/calculation. Trace 506 corresponds to a low power mode, trace 504 corresponds to a normal mode, and trace 502 corresponds to a high performance mode. These three traces (506, 504, and 502) are only examples of how the different operation modes of the digital microphone are addressed according to an embodiment. The absolute values of the trace values are dependent on the VCO-ADC design and are adjusted accordingly for a specific implementation.

To calculate the correct gain during the normal mode of operation, the startup calibration circuit 106B stores (for example in a register inside calibration calculation block 304) the temperature value at which the calibration was performed. The correction gain during operation is thus calculated relative to the "startup-calibration" temperature.

Figure 6:
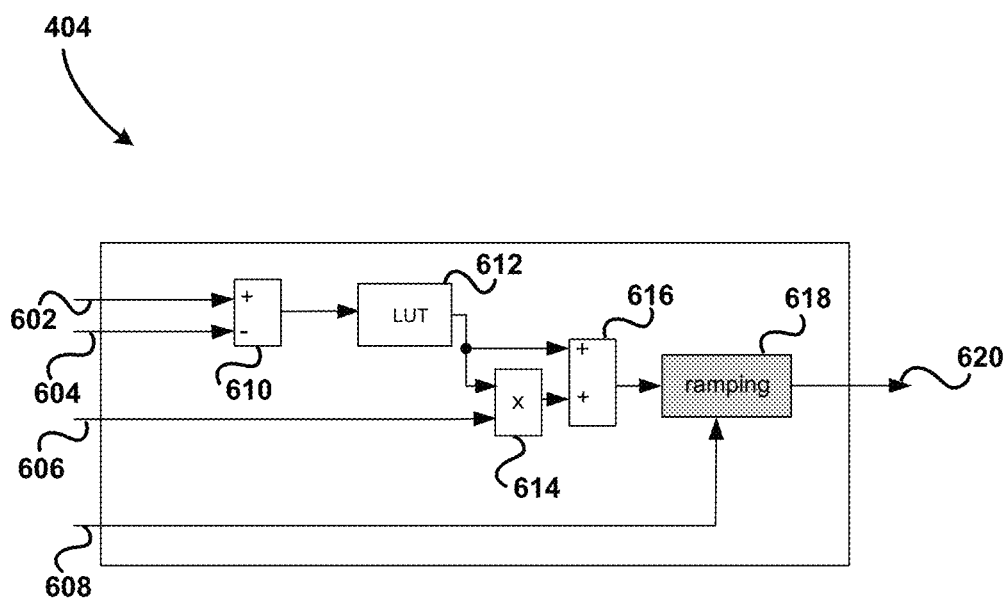
FIG. 6 is a more detailed block diagram of the temperature compensation circuit shown in FIG. 4B, including a ramp circuit, according to an embodiment.

FIG. 6 is a more detailed block diagram of the temperature compensation circuit 404 shown in FIG. 4B, including a ramp circuit 618, according to an embodiment. Temperature compensation circuit 404 includes a difference circuit 610 having a positive input for receiving the startup calibration temperature at node 602 and a negative input for receiving the actual sensed temperature at node 604. The output of difference circuit 610 is coupled to a first input of multiplication circuit 614. The output of the difference circuit 610 is the input for the LUT 612 (containing the values of traces 506, 504, 502). The output of the LUT 612 is provides a delta gain that is combined with the startup calibration gain (input node 606) in multiplication circuit 614.

The output of summer 616 reflects the correct gain delta which needs to be applied to the ramp circuit 618. The second input of multiplication circuit 614 receives the startup calibration gain at node 606. The output of difference circuit 610 is also coupled to a first input of summer 616. A second input of summer 616 is coupled to the output of multiplication circuit 614. The output of summer 616 is coupled to an input of ramp circuit 618. The ramp circuit 618 also receives a mode signal at node 608 indicative of the mode (low power model, normal mode, or high performance mode) of digital microphone 100B.

In operation, the temperature compensation circuit 404 does not immediately apply the "correction gain" when the temperature sensor 402 changes its output value due to sensing a new ambient temperature. To do so would cause an audio artefact as previously described. Instead of an instant gain-step, the correction gain is slowly ramped up/down from the current value to a calculated target value as is shown in FIG. 5. The ramping logic supports different modes to ensure the same timing behavior of the correction gain (e.g. the three operating modes have corresponding clock frequencies of 768 kHz, 1.5 MHz, and 3.072 MHz, in an embodiment). Other or additional clock frequencies can be supported in other embodiments. For example some digital microphones may have additional operating modes such as an extended clock mode requiring another clock frequency.

Ramp circuit 618 can be realized with a clock-gating circuit that has very low power consumption, which is described in further detail below with respect to FIG. 7. The ramp-timing of ramp circuit 618 can be easily readjusted (using LUTs, registers, or other components) and is also mode dependent (low power mode, normal mode, high performance mode). The ramp-timing and the gain step-size ensure are configured so that no audible artefacts are generated. In an embodiment, the ramp-timing and gain step-size are not signal dependent as is explained in further detail below with respect to FIG. 7. The ramp-timing and gain step-size described herein and shown in FIG. 5 are only one example of ramping the correction gain. The exact timing and shape of the correction gain ramp, as well as the gain step-size itself, can be changed in other embodiments without generating audible artefacts.

Figure 7:
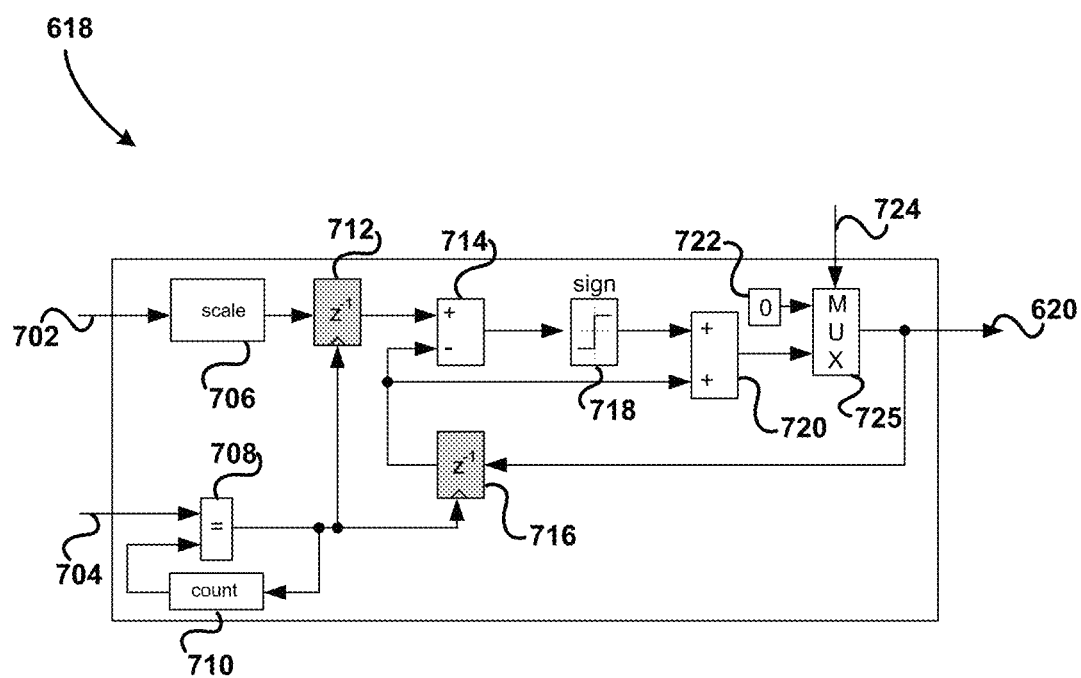
FIG. 7 is a more detailed block diagram of the ramp circuit shown in FIG. 6, according to an embodiment.

FIG. 7 is a more detailed block diagram of the ramp circuit 618 shown in FIG. 6, according to an embodiment. Ramp circuit 618 includes a pre-scaling block 706 having an input for receiving a gain signal from the output of summer 616 at input node 702. Ramp circuit 618 also includes an identity block 708 having an input for receiving a ramp timing signal at node 704 (equivalent to the "mode" signal at node 608 previously described). The output of the pre-scaling block 706 is coupled to an input of a first inverse Z-transform block 712 (also known as a clock-gating register). The output of first inverse Z-transform block 712 is coupled to a positive input of difference circuit 714. The output of difference circuit 714 is coupled to an input of "sign" block 718. The function of the sign block 718 is a minus one output for a negative input value, a zero output for a zero input, and a plus one output for a positive input value. The output of sign block 718 is coupled to a first positive input of adder 720, and the negative input of difference circuit 714 is coupled to a second positive input of adder 720. The output of adder 720 is coupled to an input of multiplexer 725. Another input of multiplexer 725 is coupled to an output of a zero bit register 722. The output of multiplexer 725 is fed back to the negative input of difference circuit 714 through a second inverse Z-transform block 716. The control inputs of the first inverse Z-transform block 712 and the second inverse Z-transform block 716 are coupled to the output of identity block 708. A counter 710 is coupled between the output of identity block 708 and a second input of identity block 708. The output of multiplexer provides the output of ramp circuit 618 at node 620.

The output signal coming of identity block 708 is the clock-enable signal (a control signal) which acts as a clock-gating signal. Only on each n-th cycle an update of the registers are performed in response to the main-clock (power saving technique). Counter 710 runs on the main-clock rate, and if the identity block 708 reaches its condition (counter output equal input at node 704), then for one cycle the clock-enable signal is triggered and the counter is also reset. This is a simple way to generate an equidistant time-grid.

In operation, difference circuit 714 calculates the difference between a "new gain" and the current state. To perform the ramping, ramp circuit 618 performs a "first glance" on the direction using sign block 718. Adder 720 combines the information (gain) of the current state plus or minus one LSB into the direction of the "new" gain state. This is done until the "new" gain state with is reached using second inverse Z-transform block 716. In summary, a slow integration upwards/downwards from the current gain state to the new gain state is performed by ramp circuit 618, according to an embodiment. Zero bit register 722 allows for the possibility of resetting the digital microphone in an embodiment.

In operation the ramp circuit 618 provides the ramping behavior realized with clock-gating functionality (for power saving reasons). A gain-change applied at the input node 702 leads to an up/down ramping depending if the actual gain is smaller/bigger than the new applied one. Since the stepping is done in one LSB steps, the gain-step-size is realized with the pre-scaling block 706. The ramp-timing and the gain step-size ensure that no audible artefacts are generated. Furthermore there is no signal dependent logic needed (e.g. zero crossing check).

In summary, the temperature calibration architecture described above with respect to FIGS. 4 through 7 compensates sensitivity drift due to temperature-dependency of the VCO-based architecture in the digital microphone during operation. The compensation is advantageously performed in a manner such that no audible artefacts are generated.

Figure 8:
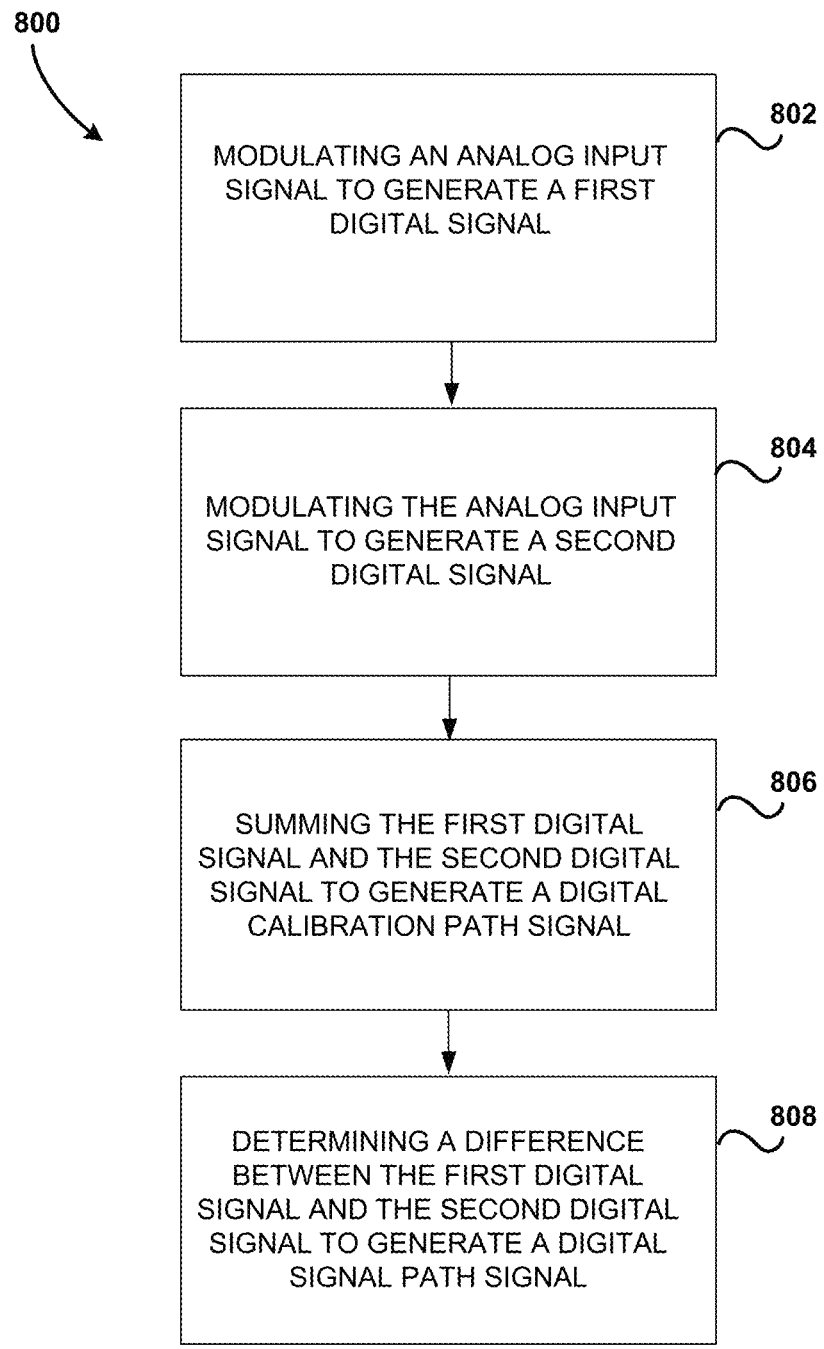
FIG. 8 is a flow chart of a method of operating a digital microphone, according to an embodiment.

FIG. 8 is a flow chart of a method 800 of operating a digital microphone, according to an embodiment. Method 800 comprises modulating an analog input signal to generate a first digital signal at step 802; modulating the analog input signal to generate a second digital signal at step 804; summing the first digital signal and the second digital signal to generate a digital calibration path signal at step 806; and determining a difference between the first digital signal and the second digital signal to generate a digital signal path signal at step 808. Method 800 further comprises applying a digital calibration path signal to a calibration path in a startup calibration mode of operation, and applying a digital signal path signal to a signal path in a normal mode of operation. Method 800 further comprises calculating a correction gain in the startup calibration mode of operation, and applying the correction gain to the signal path in the normal mode of operation. Method 800 further comprising adjusting the correction gain to correspond to one of a plurality of operating modes. Method 800 further comprises ramping the correction gain from an initial correction gain based on an initial temperature to a current correction gain based on a current temperature.

Example embodiments of the present invention are summarized here. Other embodiments can also be understood from the entirety of the specification and the claims filed herein.

Example 1. A digital microphone comprises a first modulation path having an input for receiving an analog input signal and an output for generating a first digital signal; a second modulation path having an input for receiving the analog input signal and an output for generating a second digital signal; a summing circuit having a first input for receiving the first digital signal, a second input for receiving the second digital signal, and an output for generating a digital calibration path signal; and a difference circuit having a first input for receiving the first digital signal, a second input for receiving the second digital signal, and an output for generating a digital signal path signal.

Example 2. The digital microphone of Example 1, wherein the output of the summing circuit is energized in a startup calibration mode of operation, and wherein the output of the difference circuit is energized in a normal mode of operation.

Example 3. The digital microphone of any of the above examples, further comprising a disconnect circuit for isolating the first modulation path and the second modulation path from the analog input signal during the startup calibration mode of operation.

Example 4. The digital microphone of any of the above examples, further comprising a digital-to-analog converter (DAC) circuit having an input for receiving a control signal and an output coupled to the input of the first modulation path and to the input of the second modulation path.

Example 5. The digital microphone of any of the above examples, wherein the DAC circuit comprises a memory for storing first and second DAC codes; and a DAC for receiving the first and second DAC codes.

Example 6. The digital microphone of any of the above examples, wherein the first modulation path comprises a first voltage-controlled oscillator (VCO) based analog-to-digital (ADC), and wherein the second modulation path comprises a second VCO based ADC.

Example 7. The digital microphone of any of the above examples, further comprising a startup calibration circuit having a first input coupled to the output of the summing circuit, a second input coupled to the output of the difference circuit, and an output for generating a digital signal for generating a digital output signal corresponding to the analog input signal during the normal mode of operation.

Example 8. The digital microphone of any of the above examples, wherein the startup calibration circuit comprises a calibration path and a signal path, wherein the calibration path is coupled between the first input and an internal node of the signal path, and wherein the signal path is coupled between the second input and the output.

Example 9. The digital microphone of any of the above examples, wherein the calibration path comprises a calibration calculation block configured for generating a correction gain.

Example 10. The digital microphone of any of the above examples, wherein the signal path comprises a multiplication circuit having an input coupled to the internal node of the signal path.

Example 11. A digital microphone comprises an analog-to-digital converter (ADC); a digital signal path coupled to the ADC; a temperature sensor; and a temperature compensation circuit coupled to the temperature sensor and to a node of the digital signal path, wherein the temperature compensation circuit is configured for providing a correction gain to the digital signal path during a normal mode of operation.

Example 12. The digital microphone of Example 11, wherein the ADC comprises a first modulation path having an input for receiving an analog input signal and an output for generating a first digital signal, and a second modulation path having an input for receiving the analog input signal and an output for generating a second digital signal, and wherein the digital signal path comprises a summing circuit having a first input for receiving the first digital signal, a second input for receiving the second digital signal, and an output for generating a digital calibration path signal, and a difference circuit having a first input for receiving the first digital signal, a second input for receiving the second digital signal, and an output for generating a digital signal path signal.

Example 13. The digital microphone of any of the above examples, wherein the digital signal path further comprises a startup calibration circuit.

Example 14. The digital microphone of any of the above examples, wherein the temperature compensation circuit comprises a lookup table for changing the correction gain to correspond to one of a plurality of operating modes.

Example 15. The digital microphone of any of the above examples, wherein the temperature compensation circuit comprises a ramping circuit for generating a series of stepped correction gain values.

Example 16. A method of operating a digital microphone, the method comprising modulating an analog input signal to generate a first digital signal; modulating the analog input signal to generate a second digital signal; summing the first digital signal and the second digital signal to generate a digital calibration path signal; and determining a difference between the first digital signal and the second digital signal to generate a digital signal path signal.

Example 17. The method of Example 16, wherein the digital calibration path signal is applied to a calibration path in a startup calibration mode of operation, and wherein the digital signal path signal is applied to a signal path in a normal mode of operation.

Example 18. The method of any of the above examples, further comprising calculating a correction gain in the startup calibration mode of operation, and applying the correction gain to the signal path in the normal mode of operation.

Example 19. The method of any of the above examples, further comprising adjusting the correction gain to correspond to one of a plurality of operating modes.

Example 20. The method of any of the above examples, further comprises ramping the correction gain from an initial correction gain based on an initial temperature to a current correction gain based on a current temperature.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A digital microphone comprising:
   a first modulation path having an input for receiving an analog input signal and an output for generating a first digital signal;
   a second modulation path having an input for receiving the analog input signal and an output for generating a second digital signal;
   a summing circuit having a first input for receiving the first digital signal, a second input for receiving the second digital signal, and an output for generating a digital calibration path signal; and
   a difference circuit having a first input for receiving the first digital signal, a second input for receiving the second digital signal, and an output for generating a digital signal path signal,
   wherein the output of the summing circuit is energized in a startup calibration mode of operation, and wherein the output of the difference circuit is energized in a normal mode of operation.

2. The digital microphone of claim 1, further comprising a disconnect circuit for isolating the first modulation path and the second modulation path from the analog input signal during the startup calibration mode of operation.

3. The digital microphone of claim 1, further comprising a digital-to-analog converter (DAC) circuit having an input for receiving a control signal and an output coupled to the input of the first modulation path and to the input of the second modulation path.

4. The digital microphone of claim 3, wherein the DAC circuit comprises:
   a memory for storing first and second DAC codes; and
   a DAC for receiving the first and second DAC codes.

5. The digital microphone of claim 1, wherein the first modulation path comprises a first voltage-controlled oscillator (VCO) based analog-to-digital (ADC), and wherein the second modulation path comprises a second VCO based ADC.

6. The digital microphone of claim 1, further comprising a startup calibration circuit having a first input coupled to the output of the summing circuit, a second input coupled to the output of the difference circuit, and an output for generating a digital output signal corresponding to the analog input signal during the normal mode of operation.

7. The digital microphone of claim 6, wherein the startup calibration circuit comprises a calibration path and a signal path, wherein the calibration path is coupled between the first input and an internal node of the signal path, and wherein the signal path is coupled between the second input and the output.

8. The digital microphone of claim 7, wherein the calibration path comprises a calibration calculation block configured for generating a correction gain.

9. The digital microphone of claim 7, wherein the signal path comprises a multiplication circuit having an input coupled to the internal node of the signal path.

10. The digital microphone of claim 1 further comprising:
    a temperature sensor; and
    a temperature compensation circuit coupled to the temperature sensor,
    wherein the temperature compensation circuit is configured for providing a correction gain to the digital signal path signal during the normal mode of operation.

11. A method of operating a digital microphone, the method comprising:
    modulating an analog input signal to generate a first digital signal;
    modulating the analog input signal to generate a second digital signal;
    summing the first digital signal and the second digital signal to generate a digital calibration path signal; and
    determining a difference between the first digital signal and the second digital signal to generate a digital signal path signal,
    wherein the digital calibration path signal is applied to a calibration path in a startup calibration mode of operation, and wherein the digital signal path signal is applied to a signal path in a normal mode of operation.

12. The method of claim 11, further comprising calculating a correction gain in the startup calibration mode of operation, and applying the correction gain to the signal path in the normal mode of operation.

13. The method of claim 12, further comprising adjusting the correction gain to correspond to one of a plurality of operating modes.

14. The method of claim 12, further comprising ramping the correction gain from an initial correction gain based on an initial temperature to a current correction gain based on a current temperature.

15. The method of claim 11 further comprising:
    sensing an ambient temperature; and
    providing a correction gain to the digital signal path signal during the normal mode of operation based on the sensed ambient temperature.

* * * * *